(12) United States Patent
Tanishima et al.

(10) Patent No.: US 7,149,136 B2
(45) Date of Patent: Dec. 12, 2006

(54) MEMORY CIRCUIT WITH REDUNDANT MEMORY CELL ARRAY ALLOWING SIMPLIFIED SHIPMENT TESTS AND REDUCED POWER CONSUMPTIONS

(75) Inventors: Motoko Tanishima, Kawasaki (JP); Mitsuharu Sakakibara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/290,506

(22) Filed: Dec. 1, 2005

(65) Prior Publication Data

US 2006/0083086 A1   Apr. 20, 2006

Related U.S. Application Data

(62) Division of application No. 10/633,580, filed on Aug. 5, 2003, now Pat. No. 6,999,357.

(30) Foreign Application Priority Data

Aug. 8, 2002 (JP) .............................. 2002-231452

(51) Int. Cl.
G11C 7/00 (2006.01)
G11C 7/10 (2006.01)
G11C 8/00 (2006.01)
G11C 29/00 (2006.01)
G11C 17/18 (2006.01)

(52) U.S. Cl. ................. 365/200; 365/189.05; 365/196; 365/201; 365/230.03; 365/225.7

(58) Field of Classification Search ................ 365/200, 365/201
See application file for complete search history.

(56) References Cited

U.S. PATENT DOCUMENTS

| 5,293,348 | A | 3/1994 | Abe |
|---|---|---|---|
| 5,297,085 | A | 3/1994 | Choi et al. |
| 5,555,212 | A | 9/1996 | Toshiaki et al. |
| 5,699,308 | A | 12/1997 | Wada et al. |
| 5,841,709 | A | 11/1998 | McClure |
| 5,907,514 | A | 5/1999 | Lee et al. |
| 5,914,907 | A | 6/1999 | Kobayashi et al. |
| 6,236,599 | B1 | 5/2001 | Goto |
| 6,243,307 | B1 | 6/2001 | Kawagoe |
| 6,310,807 | B1 | 10/2001 | Ooishi et al. |
| 6,320,801 | B1 * | 11/2001 | Kwak .................. 365/200 |
| 6,333,877 | B1 | 12/2001 | Nagaoka et al. |
| 6,392,938 | B1 * | 5/2002 | Choi et al. .................. 365/200 |
| 6,469,923 | B1 | 10/2002 | Hidaka |

(Continued)

FOREIGN PATENT DOCUMENTS

JP   08-124396   5/1996

(Continued)

*Primary Examiner*—Amir Zarabian
*Assistant Examiner*—Ly Duy Pham
(74) *Attorney, Agent, or Firm*—Arent Fox PLLC

(57) ABSTRACT

A memory circuit has a regular memory cell array; a redundant memory cell array that can replace a failed portion in the regular memory cell array; a redundant replacement memory for storing data on the failed portion in the regular memory cell array; and a pre-charge circuit disposed in the regular memory cell array, depending on the data on the failed portion, the failed portion in the regular memory cell array is replaced with the redundant memory cell array, whilst a pre-charge path is closed which leads to the pre-charge circuit corresponding to the failed portion. This enables a common redundant replacement memory to effect a relief of the failed portion and shutoff of the pre-charge current to the failed portion.

5 Claims, 7 Drawing Sheets

FIRST EMBODIMENT

U.S. PATENT DOCUMENTS

| | | |
|---|---|---|
| 6,625,072 B1 | 9/2003 | Ohtani et al. |
| 6,639,856 B1* | 10/2003 | Beer et al. .................. 365/200 |
| 6,643,166 B1 | 11/2003 | Ting et al. |
| 6,895,537 B1 | 5/2005 | Kawagoe et al. |
| 2002/0141258 A1 | 10/2002 | Sakata |
| 2004/0080976 A1* | 4/2004 | Hosono et al. ............. 365/145 |

FOREIGN PATENT DOCUMENTS

JP  08-138399  5/1996

* cited by examiner

FIG. 3 REDUNDANT REPLACEMENT MEMORY

TESTING CIRCUIT

SECOND EMBODIMENT

FIG. 8 REDUNDANT REPLACEMENT MEMORY
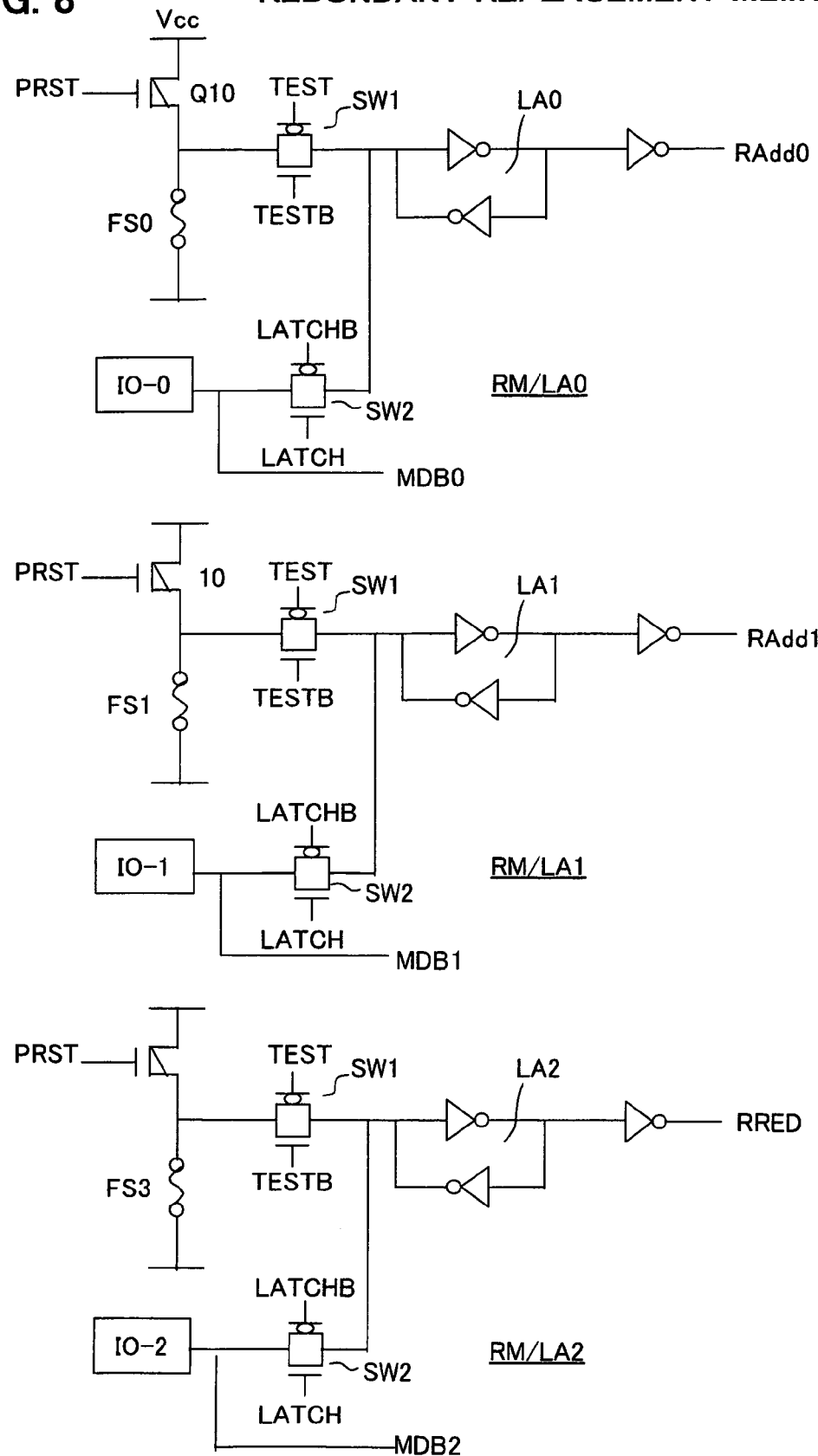

MEMORY CIRCUIT WITH REDUNDANT MEMORY CELL ARRAY ALLOWING SIMPLIFIED SHIPMENT TESTS AND REDUCED POWER CONSUMPTIONS

CROSS-REFERENCE TO RELATED APPLICATIONS

This application is based upon and claims the benefit of priority from the prior Japanese Patent Application No. 2002-231452, filed on Aug. 8, 2002, the entire contents of which are incorporated herein by reference.

This is a Division of Application Ser. No. 10/633,580 filed Aug. 5, 2003 now U.S. Pat No. 6,999,357. The disclosure of the prior application is hereby incorporated by reference herein in its entirety.

BACKGROUND OF THE INVENTION

1. Field of the Invention

The present invention relates generally to a semiconductor memory circuit, and more particularly to a memory circuit with a redundant memory cell array ensuring simplified shipment tests and reduced power consumptions.

2. Description of the Related Arts

A static RAM, one of the semiconductor memory circuits, is incorporated as a high-speed memory in, e.g., the system LSI. The static RAM has a memory cell in which inputs and outputs of a pair of CMOS inverters are cross connected to each other. One of the pair of CMOS inverters outputs H level signal whilst the other outputs L level, such that data is latched so that no current is consumed in data holding state.

The recent static RAM must meet the stringent requirement for larger capacity, in addition to its quick access capability. With the increased capacity of the static RAM, a redundant memory cell array is generally disposed in order to relieve failed cells or failed bits.

A shipping tests of the static RAM include two types of tests, a function test for checking, after predetermined data is written, whether the same data is correctly read out, and a leak test for checking, after predetermined data is first written and then held for a predetermined time, whether the same data remains held correctly. The function test is a test for checking whether write-in and read-out can properly be performed as regular memory, and this test detects as faults a short-circuit between bit lines or a trouble in the memory cell. On the contrary, the leak test detects as a fault, if leak current flows in the data hold state and data cannot be held, because of a failed transistor of the memory cell. Leak from the bit line is also regarded as one of leak faults.

When any fault is detected by the function test or by the leak test of the static RAM, the cell array is replaced with a redundant cell array in order to relieve these faults. For example, Japanese Patent Application Laid-open (kokai) Pub. No. H08-138399 proposes providing a redundant replacement memory for replacing the cell array that has failed in the function test with a redundant cell array, and a redundant replacement memory for replacing the cell array that has failed in the leak test with a redundant cell array. In this prior art, the bit line pre-charge path to the cell array that has failed in the leak test is turned off, such that pre-charge to that cell array having any leak fault is prohibited so that power consumption is cut down. To turn this pre-charge path off, a redundant replacement memory for leak test is employed.

In the above prior art, the function test and the leak test are carried out separately, and the addresses of the cell arrays that have failed in these tests are stored in respective redundant replacement memories, resulting in a complicated circuit configuration.

Another problem may occur. When a fault is detected in a memory cell array, data on the cell array having a failed bit to be replaced with a redundant cell array is written in a redundant replacement memory in order to achieve the replacement with the redundant cell array, and after that the redundant cell array needs to be subjected to the function test and the leak test.

However the redundant replacement memory is typically comprised of a fuse ROM, and the step of writing to this fuse ROM takes a long period of time since the step involves fusing of the fuse element by laser beam, thus adding to costs for the testing.

SUMMARY OF THE INVENTION

It is therefore an object of the present invention to provide a memory circuit with a redundant memory cell array allowing simplified shipment tests and reduced power consumptions.

Another object of the present invention is to provide a memory circuit having a simple circuit configuration to cease the supply of a pre-charge current to the failed cell array replaced with a redundant memory cell array as a result of leak fault.

Yet another object of the present invention is to provide a memory circuit having a simple circuit configuration to effect performance tests of the redundant memory cell array through temporary replacement with the redundant memory cell array without writing to the redundant replacement memory.

In order to achieve the above objects, according to a first aspect of the present invention there is provided a memory circuit having a regular memory cell array and a redundant memory cell array that can replace a failed portion in the regular memory cell array, the memory circuit comprising a redundant replacement memory for storing data on the failed portion in the regular memory cell array; and a pre-charge circuit disposed in the regular memory cell array, wherein depending on the data on the failed portion, the failed portion in the regular memory cell array is replaced with the redundant memory cell array, whilst a pre-charge path is closed which leads to the pre-charge circuit corresponding to the failed portion.

In the aspect of the present invention, the failed portion data is stored in the redundant replacement memory so that depending on that failed portion data, the failed portion can undergo replacement with a redundant memory cell array and shutoff of the pre-charge path to the failed portion. This enables a common redundant replacement memory to effect a relief of the failed portion and shutoff of the pre-charge current to the failed portion.

To attain the above objects, according to the second aspect of the present invention there is provided a memory circuit having a regular memory cell array, and a redundant memory cell array that can replace a failed portion in the regular memory cell array, the memory circuit comprising a redundant replacement memory for storing data on the failed portion in the regular memory cell array, wherein the redundant replacement memory includes a redundant cell for respectively holding the failed portion data, and a redundant latch circuit for latching the failed portion data held by the redundant cell, and wherein depending on the data latched by the redundant latch circuit, the failed portion is replaced with the redundant memory cell array, and the redundant latch circuit latches test data supplied from an external terminal during testing.

According to the present invention, the failed portion data for testing can be latched from the external terminal without writing the failed portion data into the redundant cell in the redundant replacement memory so that depending on the latched data, the failed portion can be replaced with the redundant memory cell array. This enables the function test, the leak test, etc., to the redundant memory cell array to be effected, prior to writing to the redundant cell.

BRIEF DESCRIPTION OF THE DRAWINGS

The above and other objects, aspects, features and advantages of the present invention will become more apparent from the following detailed description when taken in conjunction with the accompanying drawings, in which:

FIG. 8 is a circuit diagram of the redundant replacement memory for use in the second embodiment.

DESCRIPTION OF THE PREFERRED EMBODIMENTS

Preferred embodiments of the present invention will now be described with reference to the accompanying drawings. It is to be noted however that the scope of protection of the present invention is not limited to the following embodiments but extends to the invention defined in the claims and to its equivalents.

(First Embodiment)

Figure 1:
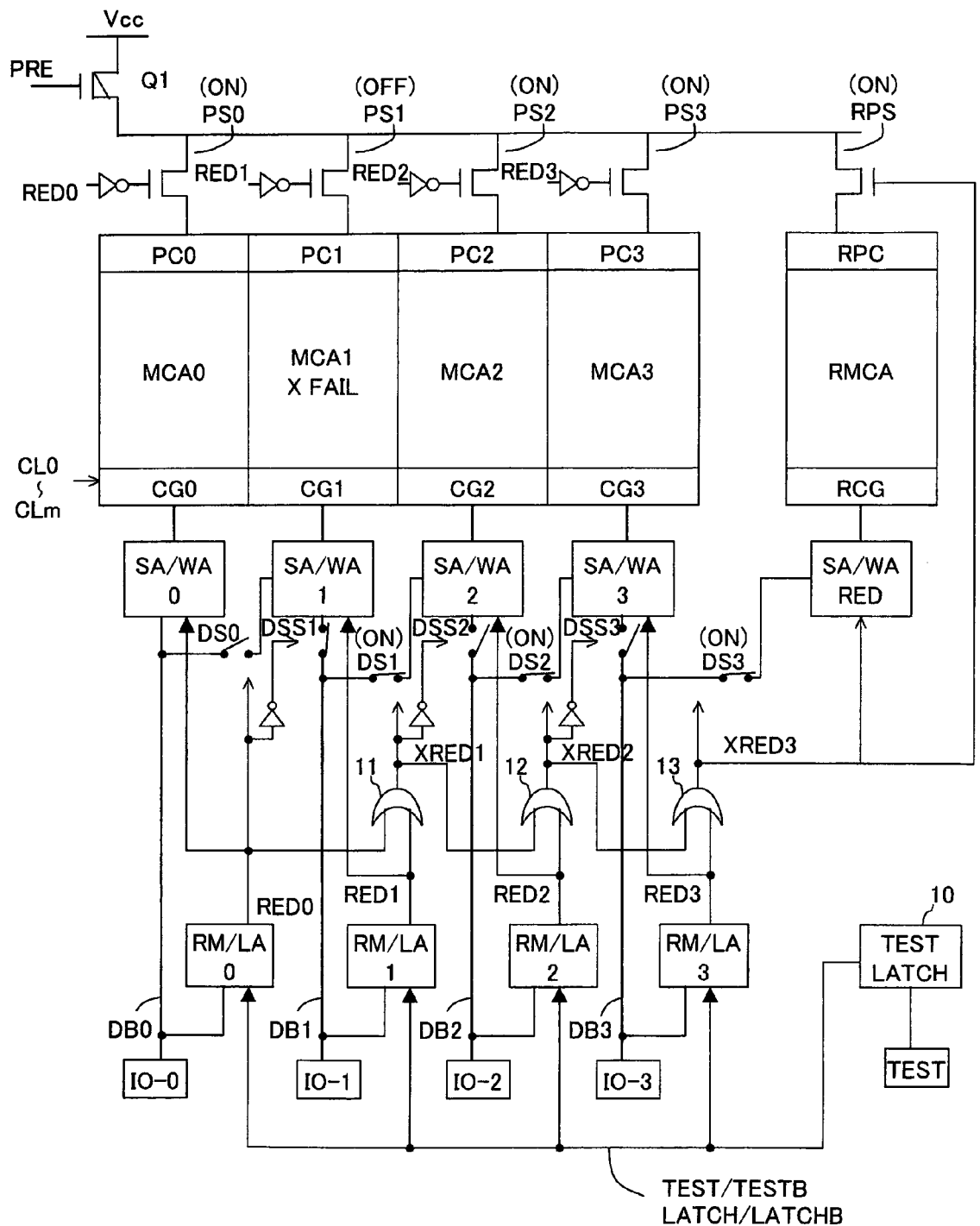
FIG. 1 illustrates the entire configuration of a memory circuit according to a first embodiment of the present invention.

FIG. 1, is an entire configuration of a memory circuit according to a first embodiment of the present invention. In the embodiment of FIG. 1, a regular memory cell array includes four memory cell arrays MCA0 to MCA3, which correspond to four I/O terminals IO-0 to IO-3, respectively. Writing data is supplied from the four I/O terminals IO-0 to IO-3 through data buses DB0 to DB3 and sense amplifiers/write amplifiers SA/WA0 to SA/WA3 to the four memory cell arrays MCA0 to MCA3. Read data from the four memory cell arrays MCA0 to MCA3 is outputted from the four I/O terminals IO-0 to IO-3 by way of the sense amplifiers/write amplifiers SA/WA0 to SA/WA3 and the data buses DB0 to DB3. The memory circuit further includes a redundant memory cell array RMCA so that, of the regular memory cell array, the memory cell array having a failed portion can be replaced with the redundant cell array. In other words, the four memory cell arrays MCA0 to MCA3 are units to be replaced with the redundant memory cell array. If the memory cell array MCA1 has a failure FAIL, that memory cell array MCA1 is replaced with the redundant memory cell array RMCA.

The memory cell arrays MCA0 to MCA3 and RMCA include a plurality of bit lines and word lines, and static memory cells disposed at the intersecting points of these lines, not shown. The memory cell arrays MCA0 to MCA3 and RMCA include pre-charge transistor circuits PC0 to PC3 and RPC, respectively, supplying pre-charge current to the bit lines, and pre-charge switches (N channel transistors) PS0 to PS3 and RPS disposed between a pre-charge transistor (P channel transistor) Q1 and the pre-charge transistor circuits PC0 to PC3 and RPC, respectively, all of which circuits make up a pre-charge circuit. The pre-charge circuit is a circuit for pre-charging the bit lines. The word lines are driven after the pre-charging so that the level of one of the paired bit lines drops depending on the state of the memory cell.

The memory cell arrays include column gates CG0 to CG3 and RCG, each of which becomes conductive in response to column selection signals CL0 to CLm. Bit lines to be associated with the memory cell arrays are selected based on the column selection signals CL1 to CLm, for connection to the sense amplifiers/write amplifiers SA/WA0 to SA/WA3.

Description is then made of the way in which the failed portion of the regular memory cell array of FIG. 1 is replaced with a redundant memory cell array. In the memory circuit of FIG. 1, respective data for the four memory cell arrays MCA0 to MCA3 are inputted to or outputted from the four I/O terminals IO-0 to IO-3, respectively. Therefore, if any failure exists in the memory cell array MCA1, the data bus DB1 of the memory cell array MCA1 is shut off, and the memory cell arrays MCA2 and MCA3 and the redundant memory cell array RMCA become associated with the I/O terminals IO-1, IO-2 and IO-3, respectively. More specifically, the sense amplifiers/write amplifiers SA/WA corresponding to the regular memory cell array and the redundant memory cell array lying rightward of the memory cell array having a failed portion are connected to the I/O terminals lying leftward of the respective amplifiers, through first data bus switches DS1–DS3. Then, the sense amplifier/write amplifier SA/WA of the memory cell array having a failed portion is disconnected from the corresponding I/O terminal by turning off second data bus switches DSS1 to DSS3.

If any failure exists in the memory cell array MCA1, control is provided such that the first data bus switch DS0 is off whereas the remaining first data bus switches DS1, DS2 and DS3 are on, with the second data bus switch DSS1 being on and the remaining second data bus switches DSS2 and DSS3 being off.

In the memory circuit, data indicative of failed portion is stored in redundant replacement memories RM/LA0 to RM/LA3. The redundant replacement memories output redundant replacement specify signals RED0 to RED3 each specifying a memory cell array to be replaced. In the redundant replacement memories RM/LA0 to RM/LA3, failed portion data "1" is stored in the redundant replacement memory corresponding to a memory cell array to be replaced with a redundant cell, whereas failed portion data "0" is stored in the redundant replacement memories corresponding to non-defective memory cell arrays other than the defective memory cell array. This means that the redundant replacement specify signals RED0 to RED3 are control signals having one-to-one correspondence with respect to the failed portion data. The first data bus switch DS0 is controlled by the redundant replacement specify signal RED0. In order to achieve a leftward shift of the cell arrays lying rightward of the memory cell array having a failed portion, the first data bus switch DS1 is controlled by a logical OR signal XRED1, that is the logical OR of the redundant replacement specify signal RED0 neighboring on the left and the redundant replacement specify signal RED1 associated with the first data bus switch DS1. In the same manner, the first data bus switch DS2 is controlled by a logical OR signal XRED2, that is the logical OR of the logical OR signal XRED1 neighboring on the left and the redundant replacement specify signal RED2 associated with the first data bus switch DS2, whilst the first data bus switch DS3 is controlled by a logical OR signal XRED3, that is the logical OR of the logical OR signal XRED2 neighboring on the left side and the redundant replacement specify signal RED3 associated with the first data bus switch DS3. To this end, logical OR gates 11,12 and 13 are disposed.

If the memory cell array MCA1 has a failed portion FAIL, the failed portion data "1" is stored in the redundant replacement memory RM/LA1, with the result that the logical OR signal XRED1 goes high level (or "1"), with all the logical OR signals XRED2 and XRED3 on its right also going high level. The memory cell arrays MCA2, MCA3 and RMCA are shifted to the left and thus connected to the I/O terminals IO-1, IO-2 and IO-3.

Furthermore, the redundant replacement specify signals RED0 to RED3 are supplied to the corresponding sense amplifiers/write amplifiers SA/WA0 to SA/WA3, respectively, for the control of activation or inactivation thereof. By this control, the sense amplifier/write amplifier is inactivated which corresponds to the memory cell array to be replaced with a redundant cell array. In the embodiment of FIG. 1, the sense amplifier/write amplifier SA/WA1 is inactivated.

The pre-charge switches PS0 to PS3 and RPS in the pre-charge circuit are subjected to conduction and non-conduction controls by the redundant replacement specify signals RED0 to RED3 and the logical OR signal XRED3. More specifically, in order not to supply a pre-charge current to the memory cell array MCA1 having the failed portion, the pre-charge switch PS1 corresponding to the memory cell array MCA1 is turned off by the inverted signal of the redundant replacement specify signal RED1. The other pre-charge switches PS0, PS2, PS3 and RPS are all turned on. The pre-charge switch RPS corresponding to the redundant memory cell array RMCA is controlled by the inverted signal of the logical OR signal XRED3 that goes high level whenever the cell array is replaced with a redundant memory cell array. Control is provided such that the pre-charge switch RPS is conducting when the replacement with the redundant memory cell array is performed, on the other hand that the pre-charge switch RPS is non-conducting when the replacement is not performed.

As has been discussed hereinabove, the first embodiment achieves, by writing failed portion data into the redundant replacement memories RM/LM0 to RM/LA3, replacement of the memory cell having a failed portion with the redundant memory cell array, as well as shutoff of the pre-charge current path to the memory cell array to be replaced.

The data bus switches DS0–DS3 and DSS1–DSS3 may be disposed between the sense amplifier/write amplifier SA/WA and the memory cell array MCA. It is possible in this case to dispense with the sense amplifier/write amplifier SA/WARED associated with the redundant memory cell array.

Figure 2:
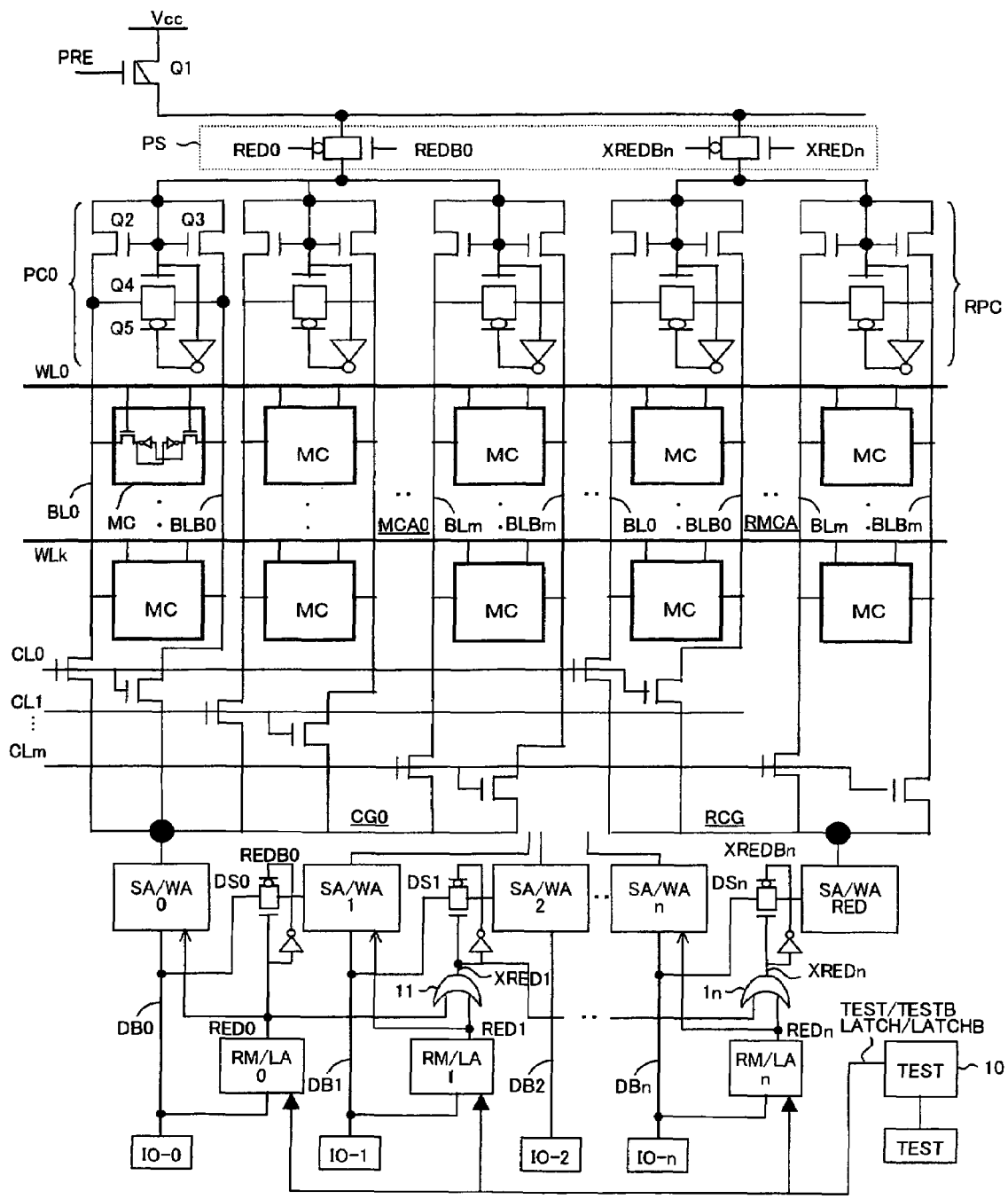
FIG. 2 is a detailed circuit diagram of a memory cell and a pre-charge circuit for use in the first embodiment.

FIG. 2 is a detailed circuit diagram of the memory cell and the pre-charge circuit in the first embodiment. In FIG. 2, the regular memory cell array MCA0 and the redundant memory cell array RMCA are shown, but the regular memory cell arrays MCA1 to MCAn are not shown. The regular memory cell array MCA0 has m+1 bit line pairs and k+1 word lines. Sense amplifiers/write amplifiers SA/WA0 to SA/WA2 and SA/WAn are shown corresponding to the regular memory cell arrays, with a sense amplifier/write amplifier SA/WARED corresponding to the redundant memory cell array. Data bus switches DS0, DS1 and DSn are comprised of transfer gates each consisting of a p-channel transistor and an n-channel transistor. The second data bus switches DSS0 to DSS3 are omitted.

FIG. 2 shows a detailed circuit of the memory cell MC. In the example of FIG. 2, n+1 regular memory cell arrays MCA0-MCAn are disposed, with a single redundant memory cell array RMCA disposed. Each memory cell MC in the memory cell array includes a pair of transfer transistors connected to a word line WL0 and a pair of bit lines BL0, BLB0 and a pair of inverters whose inputs and outputs are cross connected to each other. A pre-charge transistor circuit PC0 is connected to bit line pairs BL0, BLB0 to BLm and BLBm. The pre-charge transistor circuit PC0 has load transistors Q2 and Q3 that conduct in response to pre-charge voltages supplied from pre-charge switches PS, and equalizer transistors Q4 and Q5. The pre-charge switches PS are comprised of transfer gates each consisting of a p-channel transistor and an n-channel transistor and are disposed between the pre-charge transistor Q1 and the pre-charge transistor circuits PC0 and RPC of the memory cell arrays MCA0 and RMCA. The gates are controlled by the redundant replacement specify signals RED0 and REDB0 having an opposite phase, and logical OR signals XREDn and XREDBn. Column gates CG0 and RCG each include a group of transistors whose conduction is controlled by column selection signals CL0 to CLm.

In the memory circuit according to the first embodiment of FIGS. 1 and 2, it is possible, without writing of the failed portion data into the fuse ROMs in the redundant replacement memories RM/LA0 to RM/LAn, to replace the failed memory cell array with the redundant memory cell array RMCA and to carry out the function test and leak test of the redundant memory cell array RMCA. For this reason, a testing circuit 10 is activated through a test terminal TEST so that test data can temporarily be stored in latch circuits in the redundant replacement memories RM/LA0 to RM/LAn, through the I/O terminals IO-0 to IO-3. Based on the temporarily stored test data, one of the regular memory cell arrays is replaced with the redundant memory cell array. Thus, in such a condition, the redundant memory cell array RMCA can undergo the function test and leak test.

Figure 3:
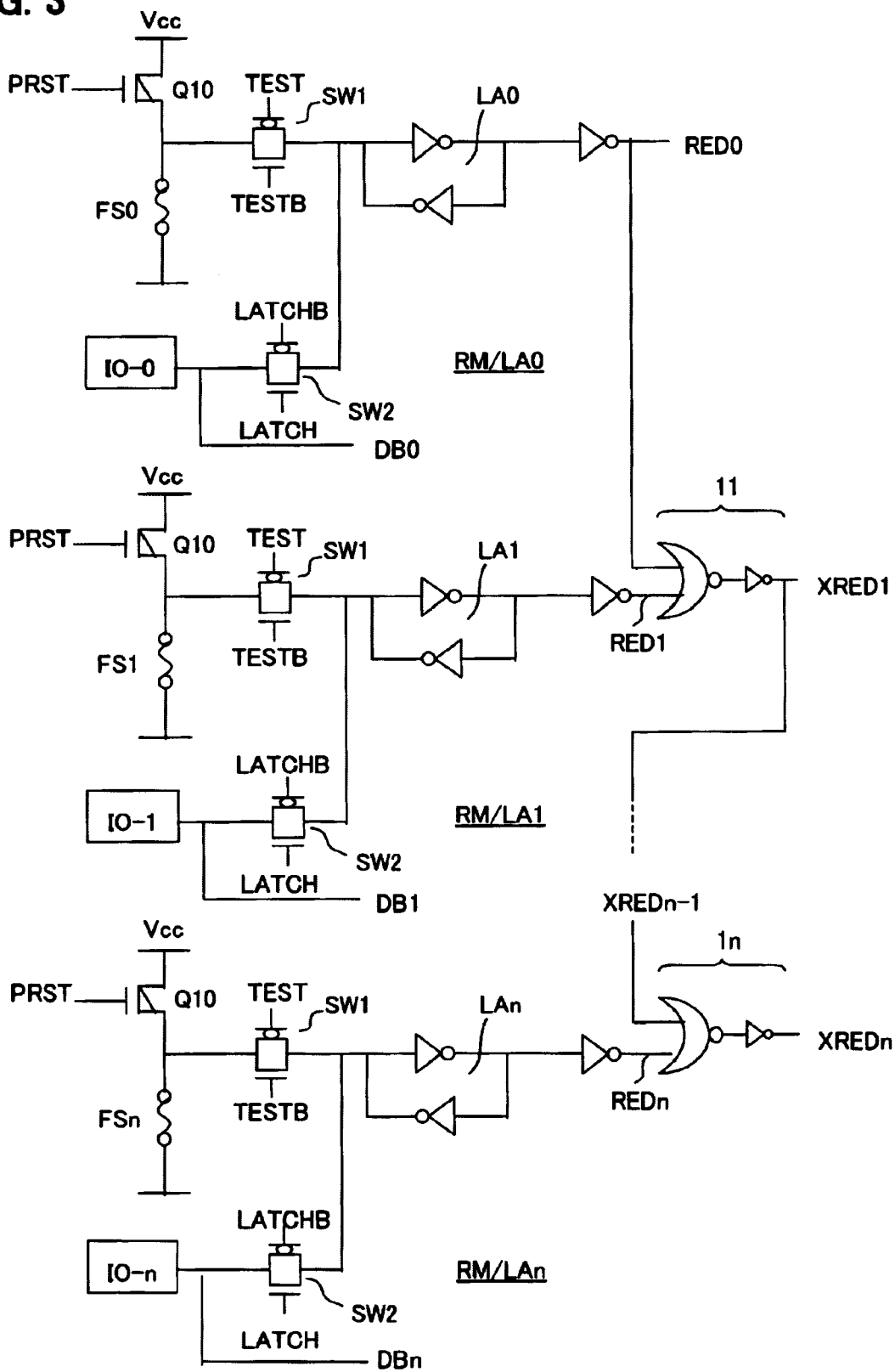
FIG. 3 is a circuit diagram of a redundant replacement memory.

FIG. 3 is a circuit diagram of the redundant replacement memory. In FIG. 3, the redundant replacement memories RM/LA0, RM/LA1 and RM/LAn are shown. The redundant replacement memories RM/LA0, RM/LA1 and RM/LAn include latch circuits LA0, LA1 and LAn, respectively, and fuse circuits consisting of fuses FS0, FS1 and FSn, respectively, for storing failed portion data, and a transistor Q10 which temporarily conducts by a power-on reset signal PRST. Between the respective fuse circuits and the respective latch circuits is disposed a first switch SW1 which is conducting during regular operations but which goes non-conductive in the testing step. Between the respective I/O terminals IO-0, IO-1 and IO-n and the respective latch circuits LA0-Lan are disposed second switches SW2 which are non-conducting during the regular operations but which goes conductive in the testing step. Logical OR circuits I1 and In each consist of a NOR gate and an inverter and correspond to logical OR gates I1 and In shown in FIG. 2.

During the regular operations, the test signal TEST is controlled to be low and the first switch SW1 is conducting. The P channel transistors Q10 temporarily conduct in response to the power-on reset signal PRST which temporarily goes low level when the power is on, thus making the latch circuits LA0, LA1 and LAn active. When the power-on reset signal PRST returns to high level and the transistors Q10 turn off, the inputs of the latch circuits are low level if the fuses FS0, FS1 and FSn are not fused, whereas the input remains high level if fused. This allows the failed portion data written in the fuses to be transferred to the latch circuits LA0, LA1 and LAn. The failed portion data latched in the latch circuits is then outputted as the redundant replacement specify signals RED0, RED1 and REDn.

During the testing step, the test signal TEST goes high level and thus all the first switches SW1 turn off. In response to a latch signal LATCH that temporarily goes high level at the beginning of the testing step, the second switch SW2 temporarily turns on, allowing test data inputted to the I/O terminals IO-0, IO-1 and IO-n to be latched by the latch circuits LA0, LA1 and LAn, respectively.

Figure 4:
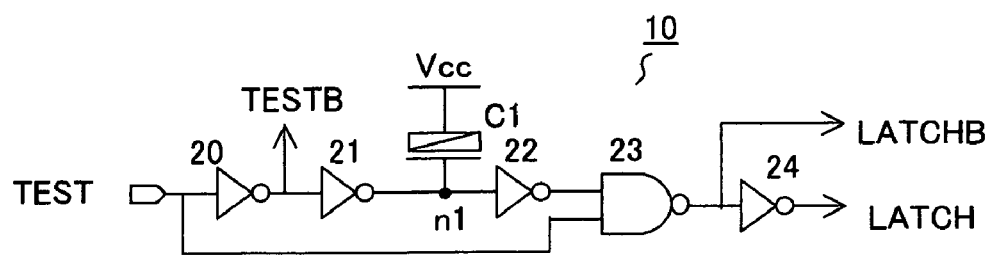
FIG. 4 is a circuit diagram of a testing circuit.
Figure 5:
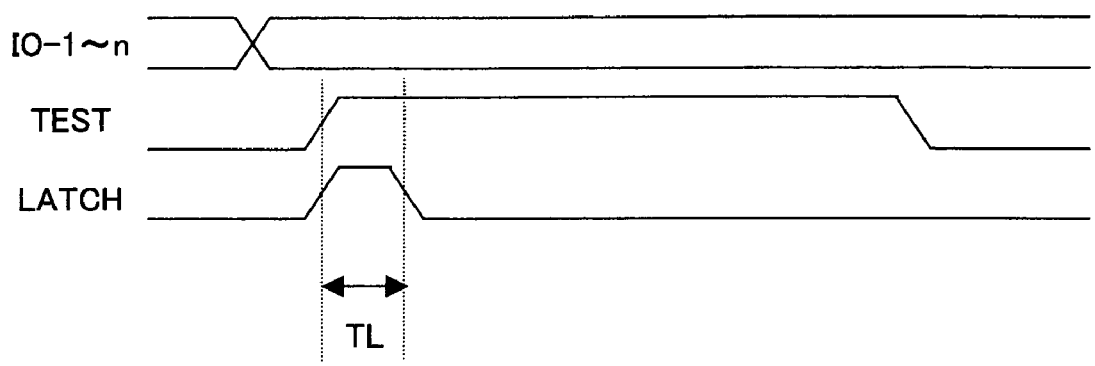
FIG. 5 illustrates operation waveforms of the testing circuit indicating a test signal and a latch signal.

FIG. 4 is a circuit diagram of a testing circuit, and FIG. 5 illustrates operation waveforms of the testing circuit indicating a test signal and a latch signal. The testing circuit 10 includes inverters 20, 21, 22 and 24, a NAND gate 23, and a capacitor C1. In the testing step, test data is fed to the I/O terminals IO-1 to IO-n, after which a high level test signal TEST is inputted from the test terminal TEST. In response to the test signal TEST, the output of the inverter 20 becomes low level. However, since it takes a predetermined time TL for the output of the inverter 21 to raise up the node n1 that has so far been low level, the output of the inverter 22 remains high level during the predetermined time, with the outputs of the NAND gate 23 and of the inverter 24 remaining low level and high level, respectively. As a result, the latch signal LATCH goes high level only during the period of time TL at the beginning of the testing step as seen in FIG. 5.

Referring back to FIG. 3, when testing of the redundant memory cell array is performed in the testing step, test data is fed as the failed portion data to the I/O terminals and the test terminal TEST is high level. In response to TEST of high level, the latch signal LATCH temporarily becomes high level, the second switches SW2 of the redundant replacement memories RM/LA0, RM/LA1 and RM/LAn turn on, with the test data fed to the I/O terminals being latched by the respective latch circuits LA0, LA1 and LAn. After the elapse of the period of time TL, all the second switches SW2 are turned off so that the I/O terminals IO-0, IO-1 and IO-n are disconnected from redundant replacement memory and are connected to the corresponding data buses DB0, DB1 and DBn, respectively.

Afterwards, depending on the test data latched by the latch circuits, one of the regular memory cell arrays is replaced with the redundant memory cell array, such that writing to and reading from the redundant memory cell array RMCA become possible through the I/O terminal IO-n. This enables the function test and leak test of the redundant memory cell array to be performed without writing to the fuse element.

After an appropriate operation of the redundant memory cell array is confirmed, data specifying a failed portion is written into the fuse element in the redundant replacement memory. Subsequently, the states of the fuse elements are latched by the latch circuits at every power on so that, depending on the failed portion data, the regular memory cell array having a failed portion is replaced with the redundant memory cell array while simultaneously shutting off the pre-charge path to the memory cell array having the failed portion.

As has been discussed hereinabove, the redundant replacement memory of FIG. 3 additionally includes first and the second switches SW1 and SW2 with the provision of the testing circuit 10, thereby making it possible to temporarily effect the replacement with the redundant memory cell array without writing of the failed portion data into the fuse ROM, in other words, to perform the testing of the redundant memory cell array during the testing step without actual replacement with the redundant memory cell array.

Figure 6:
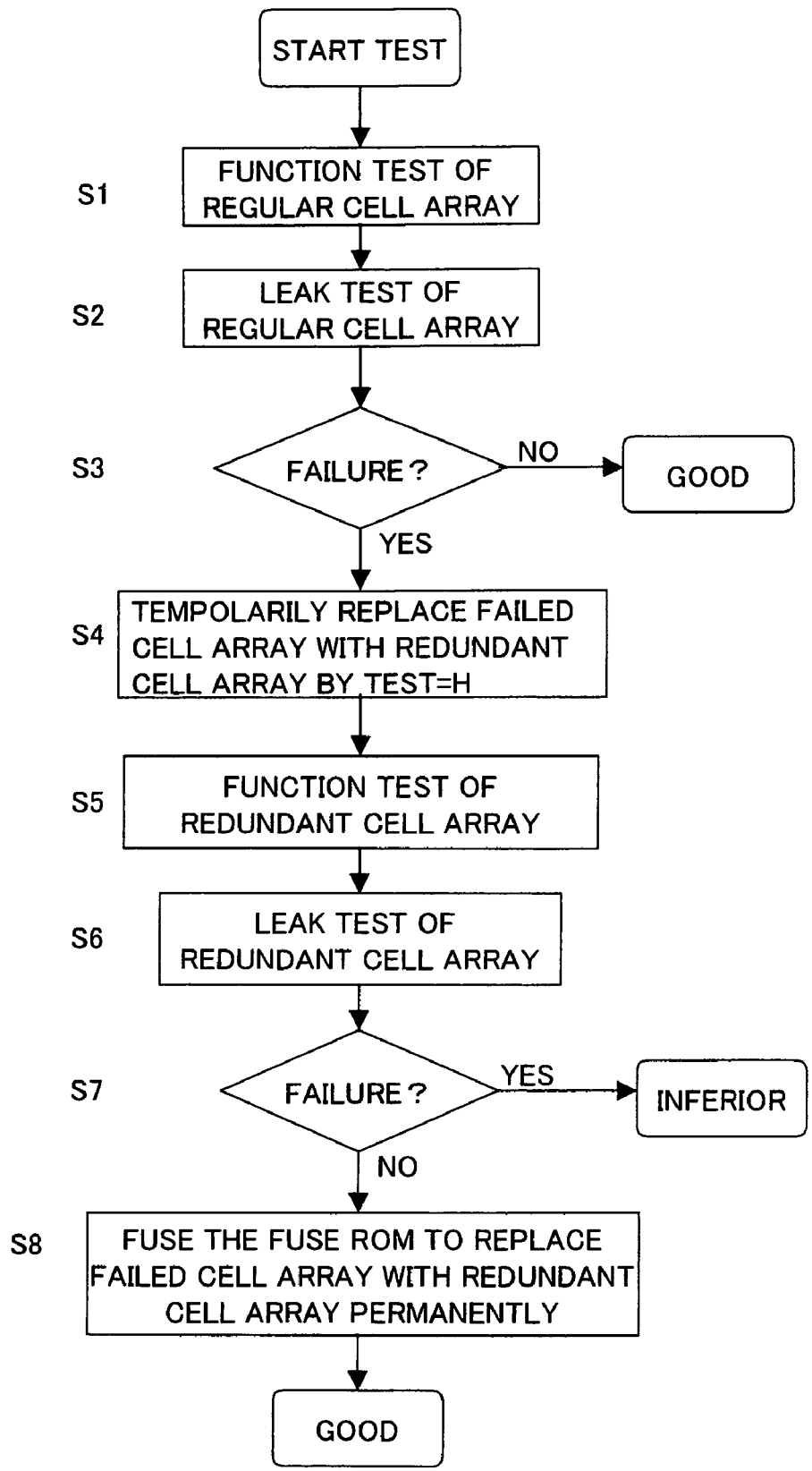
FIG. 6 is a flowchart of a testing step in the embodiment.

FIG. 6 is a flowchart of the testing step in this embodiment. In the shipment tests, the function test of the regular memory cell arrays is performed in the condition where any regular memory cell array is not replaced with the redundant memory cell array (S1). The function test includes writing predetermined data into the memory cell arrays and then reading the data to check whether correct data can be read out. The regular memory cell arrays are then subjected to the leak test (S2). This leak test includes writing predetermined data into the memory cell arrays, keeping their hold states for a predetermined period of time and thereafter reading data to see if correct data is held.

If any failed portions are not detected as the result of the function test and leak test on the regular memory cell arrays, the regular memory cell arrays are judged as being non-defectives, but if any failed portions are detected, the redundant memory cell array is tested at the next step.

Thus, with test data being fed to the I/O terminals 10, the test signal TEST is high level so that the test data is latched by the latch circuits LA0-LAn in the redundant replacement memories RM/LA0-n. As a result, depending on the test data, a predetermined regular memory cell array is temporarily replaced with the redundant memory cell array (S4). Data writing and reading are then performed through the I/O terminals to effect the function test (S5) and leak test (S6) on the redundant cell array. If any failed portion is detected in the redundant memory cell array through the two tests (S7), the memory cell array having the failed portion can no longer be replaced with the redundant memory cell array and is judged as being defective. On the contrary, if it is confirmed that the redundant memory cell array is free from any defect, then failed portion data for specifying a memory cell array having the failed portion is written into the fuse ROM in the redundant replacement memory. This achieves a permanent replacement with the redundant memory cell array (S8).

Once replaced with the redundant memory cell array, the pre-charge path to the memory cell array having a failed portion is shut off, thus avoiding any increase in the power consumption arising from leak from the failed portion.

(Second Embodiment)

Figure 7:
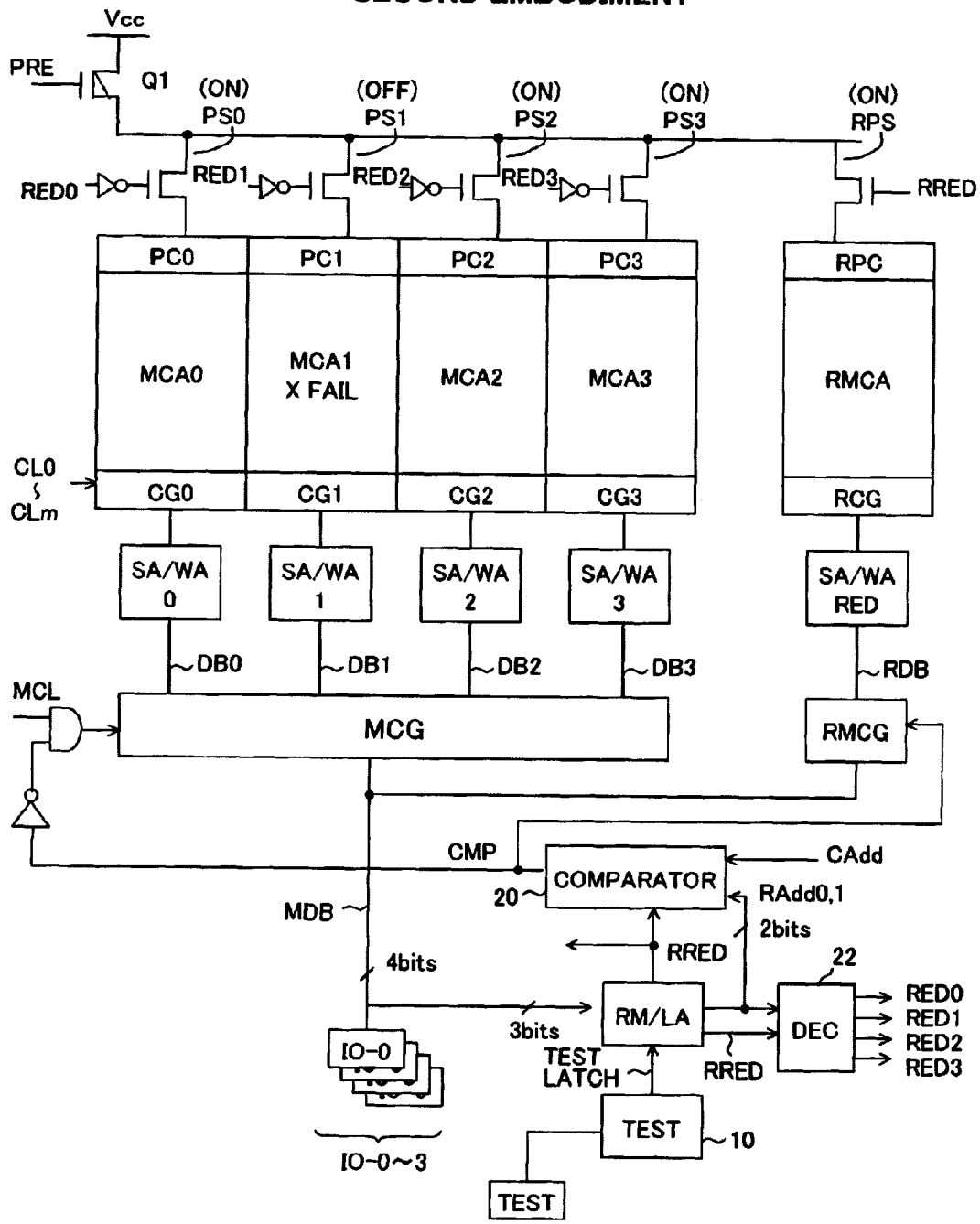
FIG. 7 illustrates the entire configuration of a memory circuit according to a second embodiment of the present invention.

FIG. 7 illustrates the entire configuration of a memory circuit according to a second embodiment of the present invention. Similar to FIG. 1, the regular memory cell array of the second embodiment includes four memory cell arrays MCA0 to MCA3, together with a single redundant memory cell array RMCA. The memory cell arrays MCA0 to MCA3 and RMCA include pre-charge transistor circuits PC0 to PC3 and RPC, respectively, column gates CG0 to CG3 and RCG, respectively, and sense amplifier/write amplifier circuits SA/WA0 to SA/WA3 and SA/WARED, respectively.

The memory cell arrays MCA0 to MCA3 and RMCA are provided with pre-charge switches PS0 to PS3 and RPS, respectively, disposed between the respective memory cell arrays and a pre-charge transistor Q1.

In this embodiment, one (or one group) of data buses DB0 to DB3 of the memory cell arrays is selected by a main column gate MCG so that a main data bus MDB is connected to I/O terminals IO-0 to IO-3. Anterior to the I/O terminals are disposed I/O circuits not shown in FIG. 7. Thus, one of the four memory cell arrays MCA0 to MCA3 is selected and subjected to data writing or data reading.

The memory cell array having a failed portion is replaced with the redundant memory cell array RMCA. To this end, 2-bit address RAdd0, 1 of the memory cell array having a failed portion is stored in a redundant replacement memory RM/LA as the failed portion data and the failed portion data is compared with column address CAdd by a comparator circuit 20. If the two addresses match, a comparison result signal CMP from the comparator circuit 20 goes high level, deactivating the operation of the main column gate MCG and activating the redundant main column gate RMCG so that the redundant data bus RDB is eventually connected to the main data bus MDB. For example, if the memory cell array MCA1 having a failed portion FAIL is selected, the redundant memory cell array RMCA is selected in place of the memory cell array MCA1, with the result that the sense amplifier/write amplifier SA/WARED of the redundant memory cell array is connected to the I/O terminals.

On the other hand, if the two addresses do not match, the comparison result signal CMP from the comparator circuit 20 goes low level, activating the main column gate MCG so that the selected regular memory cell array is connected to the I/O terminal. Outputs of 4-bit data buses DB from the respective memory cell arrays allow respective connections to the four I/O terminals 100 to 103.

The redundant replacement memory RM/LA also stores data indicative of whether the recorded failed portion data is valid. If valid failed portion data is stored, a valid flag RRED is set to high level, activating the comparator circuit 20 for the address comparison. The valid flag RRED controls the pre-charge switch RPS corresponding to the redundant memory cell array RMCA. When the regular memory cell array is replaced with the redundant memory cell array, and the valid flag RRED goes high level, the pre-charge switch RPS turns on.

Failed portion data RAdd0,1 stored in the redundant replacement memory RM/LA is decoded by a decoder 22 to generate the specify signals RED0 to RED3 for specifying a regular memory cell array having a failed portion. This decoder 22 is also activated by the valid flag RRED. When the valid flag REED is low level, the decoder 22 becomes inactive allowing all the redundant replacement specify signals REDO to RED3 to go low level, turning on all the pre-charge switches PS0 to PS3 of the regular memory cell arrays. On the contrary, when the valid flag REED is high, the decoder 22 becomes active allowing one of the redundant replacement specify signals REDO to RED3 to go high level, turning off the pre-charge switch corresponding thereto. This results in shutoff of supply of the pre-charge current to the memory cell array having a failed portion to be replaced.

FIG. 8 is a circuit diagram of the redundant replacement memory in the second embodiment. The redundant replacement memory of the second embodiment stores three(3) bits in total, i.e., 2-bit column address RAdd0,1 of the memory cell array to be replaced and 1-bit valid flag RRED. Similar to the first embodiment, the redundant replacement memories RM/LA0 to RM/LA2 each include a fuse circuit Q10 and FS, a latch circuit LA, and a first and a second switches SW1 and SW2.

During the ordinary operations, the first switch SW1 is conducting and the latch circuits LA0 to LA2 latch data written into the fuse when power is on. In the testing step, the first switch SW1 is non-conducting, and in response to a latch signal LATCH that temporarily becomes high level so that the second switch SW2 temporarily conducts, allowing the test data supplied to the I/O terminals IO-0 to IO-2 to be latched by the corresponding latch circuits LA0-2.

The testing circuit 10 and the test signal TEST and latch signal LATCH generated by the testing circuit are the same as those shown in FIGS. 4 and 5. In other words, the test signal TEST goes high level during the testing, with the latch signal LATCH becoming high level only for the initial period of the testing.

In the second embodiment as well, test data from the I/O terminal is latched into the latch circuit without any writing to the fuse element, with the redundant memory cell array being connected to the I/O terminal and subjected to the function test and the leak test. Furthermore, depending on the failed portion data stored in the redundant replacement memory, the replacement with the redundant memory cell array, as well as shutoff of the pre-charge path leading to a regular memory cell array to be replaced are effected.

In the above two embodiments, the present invention is applied to two examples: first one in which arrangement is such that the regular memory cell arrays are connected to the respective I/O terminals, with the redundant replacement memory storing "1" into the bit corresponding to the memory cell array having a failed portion; and second one in which arrangement is such that a selected regular memory cell array is connected to the I/O terminals, with the redundant replacement memory storing the address of the memory cell array having a failed portion. It will be appreciated however that the present invention is applicable to any memory circuits having the other redundant configurations.

As set forth hereinabove, according to the present invention, the memory circuit replacing a failed portion with a redundant cell array uses failed portion data stored in the redundant replacement memory cell, to effect replacement with the redundant memory cell and stop the supply of pre-charge current to the memory cell array having the failed portion, thus cutting down the power consumption. Furthermore, according to the present invention, temporary replacement with the redundant memory cell array can be carried out without recording the failed portion data in a redundant ROM of the redundant replacement memory, thus enabling the redundant memory cell array to be tested prior to writing in the redundant ROM.

What is claimed is:

1. A memory circuit comprising:
   a regular memory cell array;
   a redundant memory cell array which enables to replace a failed portion in the regular memory cell array; and
   a redundant replacement memory for storing data on the failed portion in the regular memory cell array, wherein
   the redundant replacement memory includes a redundant cell for holding failed portion data, and a redundant latch circuit for latching the failed portion data held by the redundant cell,
   depending on the data latched by the redundant latch circuit, the failed portion is replaced with the redundant memory cell array, and the redundant latch circuit latches test data supplied from an external terminal for temporary replacement of the regular memory cell array with the redundant memory cell array during testing, wherein the supply of the failed portion data held by the redundant cell to the redundant latch circuit is prohibited during the testing.

2. The memory circuit according to claim 1, wherein the redundant replacement memory includes a first switch interposed between the redundant cell and the redundant latch circuit, and a second switch interposed between the external terminal and the redundant latch circuit, and wherein during regular operation, control is provided such that the first switch is conducting and the second switch is non-conducting, whereas during the testing, control is provided such that the first switch is non-conducting and the second switch is conducting.

3. The memory circuit according to claim 2, wherein during the testing, control is provided such that the second switch temporarily conducts and thereafter goes non-conducting.

4. The memory circuit according to claim 1, wherein the external terminal is an I/O terminal for data input to and data output from the memory cell array.

5. The memory circuit according to claim 1, wherein depending on the data latched by the redundant latch circuit, a pre-charge path which leads to the pre-charge circuit corresponding to the failed portion is closed.

* * * * *